United States Patent
Yang (10) Patent No.: US 8,902,682 B2
(45) Date of Patent: Dec. 2, 2014

(54) SEMICONDUCTOR MEMORY DEVICE

(75) Inventor: Sun Suk Yang, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 317 days.

(21) Appl. No.: 13/615,371

(22) Filed: Sep. 13, 2012

(65) Prior Publication Data

US 2013/0308401 A1 Nov. 21, 2013

(30) Foreign Application Priority Data

May 21, 2012 (KR) .................. 10-2012-0053906

(51) Int. Cl.
*G11C 7/00* (2006.01)
(52) U.S. Cl.
USPC .......................................... 365/191; 365/193
(58) Field of Classification Search
USPC .......................................... 365/191, 193, 198
See application file for complete search history.

(56) References Cited

U.S. PATENT DOCUMENTS

| | | | |
|---|---|---|---|
| 7,145,814 B2 * | 12/2006 | Park | 365/193 |
| 2003/0210600 A1 * | 11/2003 | Koo et al. | 365/226 |
| 2005/0024932 A1 * | 2/2005 | Ohshima et al. | 365/158 |
| 2011/0040829 A1 | 2/2011 | Lee et al. | |

FOREIGN PATENT DOCUMENTS

KR 1020110056124 A 5/2011

* cited by examiner

*Primary Examiner* — Vu Le
(74) *Attorney, Agent, or Firm* — William Park & Associates Patent Ltd.

(57) ABSTRACT

A semiconductor memory device includes an internal signal generation block configured to generate a control signal which is enabled from a generation time of an internal active signal enabled if it is determined that a combination of external commands in synchronization with a rising edge of an external clock inputted from an outside is a preset combination, to a disable time an internal idle signal; and an internal command signal generation block configured to generate an internal write signal if it is determined that a combination of counting signals counted during an enable period of the control signal is a first combination and generate an internal precharge signal if it is determined that the combination of the counting signals is a second combination.

20 Claims, 8 Drawing Sheets

SEMICONDUCTOR MEMORY DEVICE

CROSS-REFERENCE TO RELATED APPLICATION

The present application claims priority under 35 U.S.C 119(a) to Korean Patent Application No. 10-2012-0053906 filed on May 21, 2012 in the Korean Intellectual Property Office, which is incorporated herein by reference in its entirety set forth in full.

BACKGROUND

In order to test the normal operation lifetime of a semiconductor memory device under actual circumstances, a huge amount of time is required. It is important to shorten a test time while precisely predicting the operation lifetime of the semiconductor memory device. To meet this need, a burn-in test is employed.

In the burn-in test, a word line of a semiconductor memory device is activated with a voltage higher than a normal operation voltage and under circumstances with a temperature higher than a normal operation temperature, stresses are repeatedly applied by performing a write operation and a precharge operation for a memory cell, and then, pass/fail of the memory cell is tested.

An operation of such a burn-in test to apply stresses to a memory cell will be described below with reference to FIG. 1.

Figure 1:
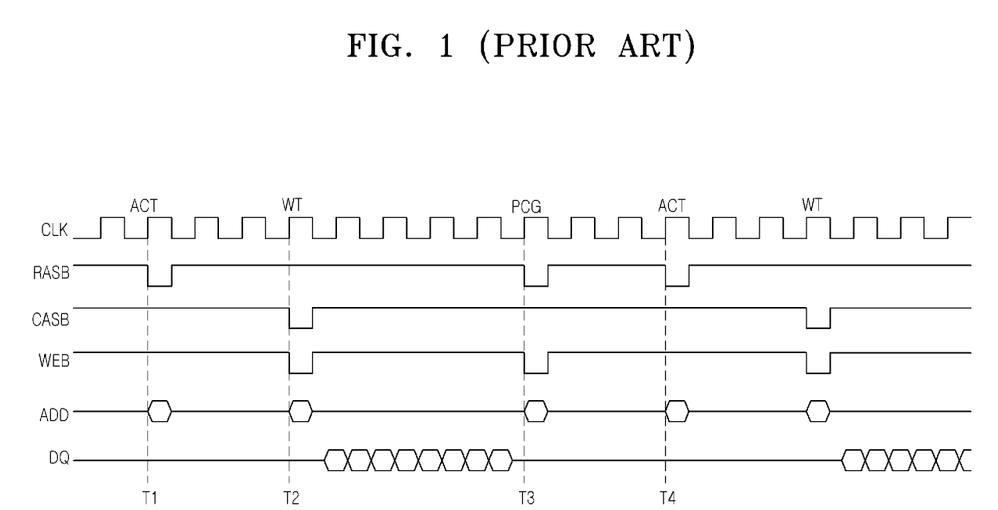
FIG. 1 is a timing diagram illustrating an operation for performing a burn-in test in a conventional semiconductor memory device.

FIG. 1 is a timing diagram explaining an operation for performing a burn-in test of a conventional semiconductor memory device.

First, a semiconductor memory device performs an active operation ACT at a time T1, in which a word line is activated according to a combination of external commands RASB, CASB and WEB and an address ADD inputted in synchronization with an external clock CLK inputted from external test equipment.

Next, the semiconductor memory device performs a write operation WT at a time T2, in which the data inputted through a DQ pad DQ are written to a memory cell according to a combination of the external commands RASB, CASB and WEB and the address ADD inputted in synchronization with the external clock CLK.

Then, the semiconductor memory device performs a precharge operation PCG at a time T3, in which a bit line is precharged according to a combination of the external commands RASB, CASB and WEB and the address ADD inputted in synchronization with the external clock CLK.

Thereupon, the semiconductor memory device performs, at a time T4, the active operation ACT the same as that at the time T1 and then repeatedly performs the write operation WT and the precharge operation PCG to apply stresses to the memory cell.

Such a burn-in test of the semiconductor memory device is performed in synchronization with the external clock CLK. However, when the operation speed of the external test equipment is slow, the frequency of the external clock CLK is low, and as the frequency of the external clock CLK is low, a time for performing the burn-in test is lengthened.

SUMMARY

An embodiment of the present invention relates to a semiconductor memory device which internally generates internal command signals in synchronization with the rising edge of the external clock inputted from an outside and performs a burn-in test in synchronization with the internal command signals, thereby being capable of shortening a burn-in test time.

In one embodiment, a semiconductor memory device includes: an internal signal generation block configured to generate a control signal which is enabled from a generation time of an internal active signal enabled if it is determined that a combination of external commands in synchronization with a rising edge of an external clock inputted from an outside is a preset combination, to a disable time of an internal idle signal; and an internal command signal generation block configured to generate an internal write signal if it is determined that a combination of counting signals counted during an enable period of the control signal is a first combination and generate an internal precharge signal if it is determined that the combination of the counting signals is a second combination.

In another embodiment, a semiconductor memory device includes: an internal active signal generation unit configured to generate an internal active signal if it is determined that a combination of internal commands is a preset combination, in synchronization with a rising edge of an external clock inputted from an outside; an internal idle signal generation unit configured to generate an internal idle signal which is enabled from a generation time of the internal active signal to a generation time of an internal precharge signal; and a control signal generation unit configured to generate a control signal which is enabled from the generation time of the internal active signal to a disable time of the internal idle signal, in response to a test mode signal.

In still another embodiment, a semiconductor memory device includes: an internal command signal generation block configured to generate internal command signals in synchronization with a rising edge of an external clock that is inputted from a source external to the semiconductor device, such that the memory device operates in synchronization with the internal commands signals to perform a burn in test.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 2:
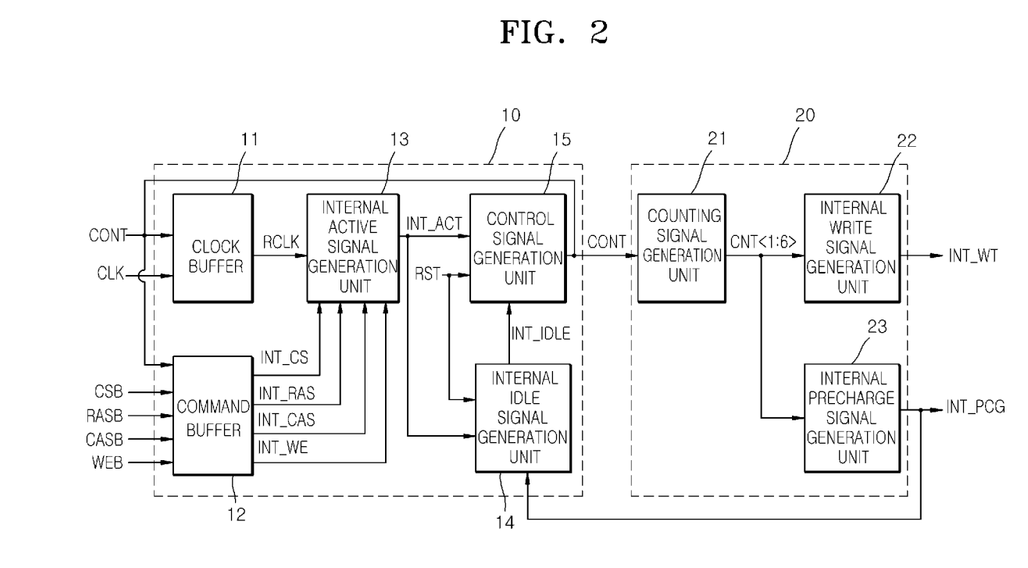
FIG. 2 is a block diagram showing the configuration of a semiconductor memory device in accordance with an embodiment of the present invention.

FIG. 2 is a block diagram showing the configuration of a semiconductor memory device in accordance with an embodiment of the present invention.

Referring to FIG. 2, a semiconductor memory device includes an internal signal generation block 10 configured to generate a control signal CONT which is enabled from a generation time of an internal active signal INT_ACT enabled if it is determined that the combination of external commands CSB, RASB, CASB and WEB in synchronization with the rising edge of an external clock CLK inputted from an outside is a preset combination, to a disable time of an internal idle signal INT_IDLE. That is, the control signal CONT may be enabled when the internal active signal INT_ACT is enabled, and the control signal CONT may be disabled when the internal idle signal INT_IDLE is disabled. The semiconductor memory device may also include an internal command signal generation block 20 configured to generate an internal write signal INT_WT if it is determined that the combination of counting signals CNT<1:6> counted during the enable period of the control signal CONT is a first combination and generate an internal precharge signal INT_PCG when the combination of the counting signals CNT<1:6> is a second combination.

The internal signal generation block 10 includes a clock buffer 11, a command buffer 12, an internal active signal generation unit 13, an internal idle signal generation unit 14, and a control signal generation unit 15.

The clock buffer 11 is configured to receive the control signal CONT and in response to the control signal CONT the clock buffer 11 may generate a rising clock RCLK which is enabled in synchronization with the rising edge of the external clock CLK inputted from the outside.

The command buffer 12 is configured to receive the control signal CONT, buffer the external commands CSB, RASB, CASB and WEB inputted from the outside in response to the control signal CONT, and generate internal commands INT_CS, INT_RAS, INT_CAS and INT_WE. The external commands include a chip select signal CSB, a RAS signal RASB, a CAS signal CASB and a write enable signal WEB. Also, the internal commands include an internal chip select signal INT_CS, an internal RAS signal INT_RAS, an internal CAS signal INT_CAS and an internal write enable signal INT_WE.

The internal active signal generation unit 13 is configured to generate the internal active signal INT_ACT enabled if it is determined that the combination of the internal commands INT_CS, INT_RAS, INT_CAS and INT_WE in synchronization with the rising edge of the external clock CLK inputted from the outside is a preset combination.

The configuration of the internal active signal generation unit 13 will be described below in detail with reference to FIG. 3.

Figure 3:
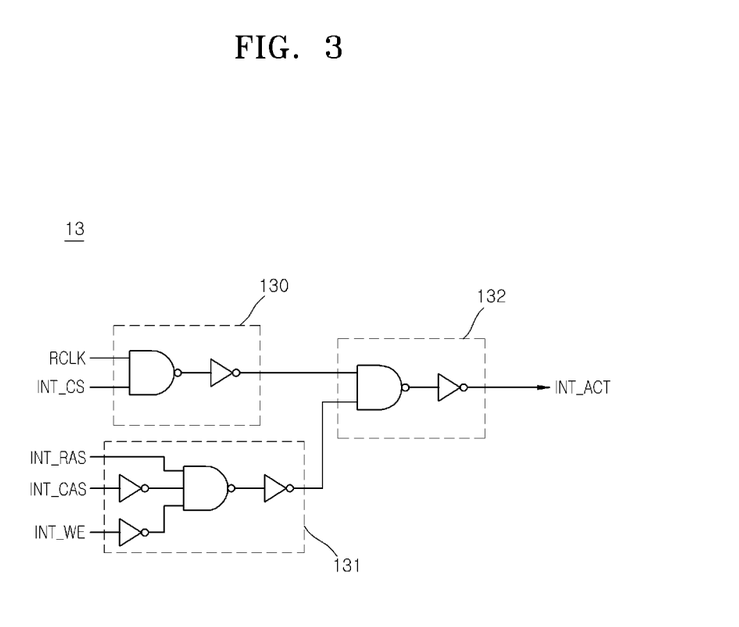
FIG. 3 is a circuit diagram of an internal active signal generation unit included in an internal signal generation block shown in FIG. 2.

Referring to FIG. 3, the internal active signal generation unit 13 includes first to third logic sections 130 to 132. The first logic section 130 is configured to AND the rising clock RCLK and the internal chip select signal INT_CS and output a resultant signal. The second logic section 131 is configured to AND the internal RAS signal INT_RAS, the internal CAS signal INT_CAS and the internal write enable signal INT_WE and output a resultant signal. The third logic section 132 is configured to AND the output signal of the first logic section 130 and the output signal of the second logic section 131 and generate the internal active signal INT_ACT. That is to say, the internal active signal generation unit 13 generates the internal active signal INT_ACT enabled at an enable time of the rising clock RCLK, if it is determined that the internal chip select signal INT_CS is inputted at a logic high level, the internal RAS signal INT_RAS is inputted at a logic high level, the internal CAS signal INT_CAS is inputted at a logic low level and the internal write enable signal INT_WE is inputted at a logic low level.

The internal idle signal generation unit 14 is configured to generate the internal idle signal INT_IDLE which is enabled from the generation time of the internal active signal INT_ACT to a generation time of the internal precharge signal INT_PCG after a power-up period.

A configuration of the internal idle signal generation unit 14 will be described below in detail with reference to FIG. 4.

Figure 4:
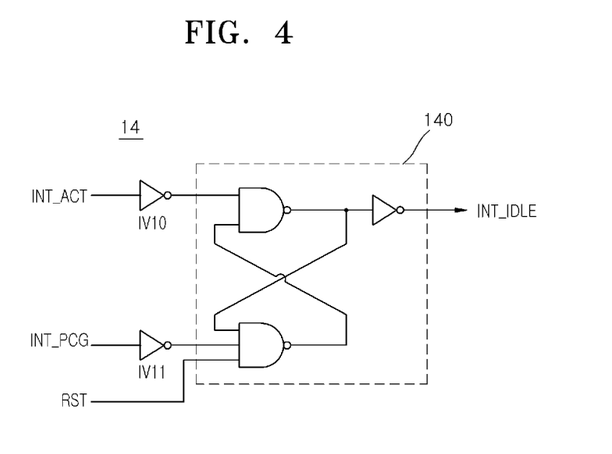
FIG. 4 is a circuit diagram of an internal idle signal generation unit included in the internal signal generation block shown in FIG. 2.

Referring to FIG. 4, the internal idle signal generation unit 14 includes inverters IV10 and IV11 and a latch section 140. The inverter IV10 inversion-buffers the internal active signal INT_ACT and outputs a resultant signal. The inverter IV11 inversion-buffers the internal precharge signal INT_PCG and outputs a resultant signal. The latch section 140 is configured to receive the output signal of the inverter IV11 and a reset signal RST, buffer the output signal of the inverter IV10 and generate the internal idle signal INT_IDLE. That is to say, the internal idle signal generation unit 14 generates the internal idle signal INT_IDLE which is enabled at the generation time of the internal active signal INT_ACT after the power-up period and is disabled at the generation time of the internal precharge signal INT_PCG. The reset signal RST is a signal which is enabled to a logic low level during the power-up period in which the internal voltage level of the semiconductor memory device rises according to the level of a power supply voltage.

The control signal generation unit 15 is configured to generate the control signal CONT which is enabled from an enable time of the internal active signal INT_ACT to the disable time of the internal idle signal INT_IDLE when a test mode is entered.

The configuration of the control signal generation unit 15 will be described below in detail with reference to FIG. 5.

Figure 5:
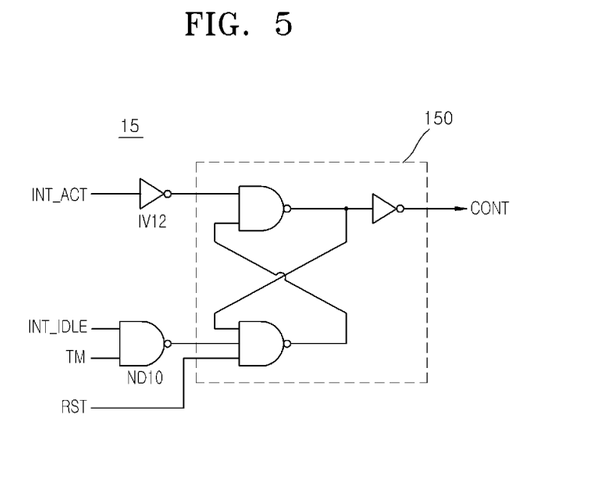
FIG. 5 is a circuit diagram of a control signal generation unit included in the internal signal generation block shown in FIG. 2.

Referring to FIG. 5, the control signal generation unit 15 includes an inverter IV12, a logic element ND10 and a latch section 150. The inverter IV12 inversion-buffers the internal active signal INT_ACT and outputs a resultant signal. The logic element ND10 NANDs the internal idle signal INT_IDLE and a test mode signal TM and outputs a resultant signal. The latch section 150 is configured to receive the output signal of the logic element ND10 and the reset signal RST, buffer the output signal of the inverter IV12, and generate the control signal CONT. That is to say, the control signal generation unit 15 generates the control signal CONT which is enabled at the time when the internal active signal INT_ACT is generated after the power-up period lapses and the test mode is entered and the control signal CONT is disabled at a time when the internal idle signal INT_IDLE is generated. The test mode signal TM is a signal which is enabled to a logic high level when the test mode is entered.

The internal command signal generation block 20 includes a counting signal generation unit 21, an internal write signal generation unit 22, and an internal precharge signal generation unit 23.

The counting signal generation unit 21 is configured to receive the control signal CONT and count the counting signals CNT<1:6> in response to the control signal CONT.

A configuration of the counting signal generation unit 21 will be described below in detail with reference to FIG. 6.

Figure 6:
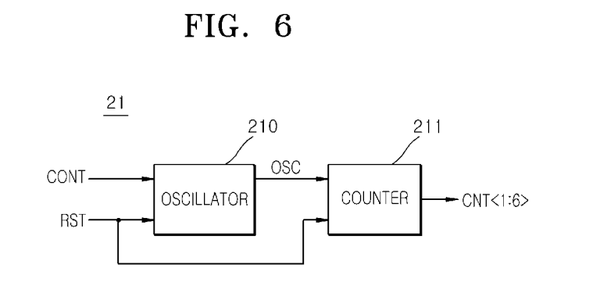
FIG. 6 is a block diagram of a counting signal generation unit included in a internal command generation block shown in FIG. 2.

Referring to FIG. 6, the counting signal generation unit 21 includes an oscillator 210 configured to receive the reset signal RST which is enabled during the power-up period in which the level of an internal voltage rises according to the level of the power supply voltage, and the oscillator 210 may be configured to generate a period signal OSC at a time when the control signal CONT is inputted after the power-up period. The counting signal generation unit 21 may also include a counter 211 configured to receive the reset signal RST and the period signal OSC and count the counting signals CNT<1:6> in response to the period signal OSC after the power-up period.

A configuration of the oscillator 210 will be described below in detail with reference to FIG. 7.

Figure 7:
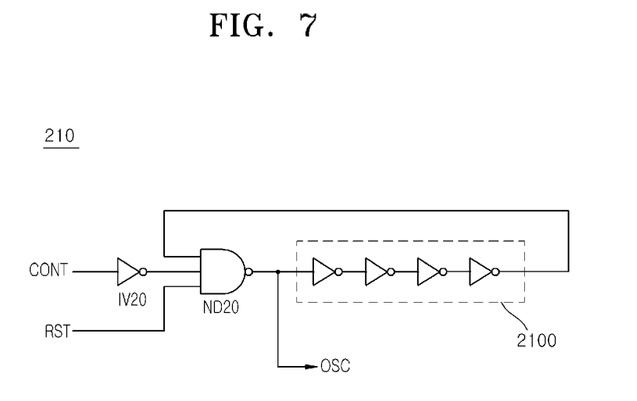
FIG. 7 is a circuit diagram of an oscillator included in the counting signal generation unit shown in FIG. 6.

Referring to FIG. 7, the oscillator 210 includes an inverter IV20, a logic element ND20, and a delay part 2100. The inverter IV20 inversion-buffers the control signal CONT and outputs a resultant signal. The logic element ND20 NANDs the output signal of the inverter IV20, the reset signal RST and the output signal of the delay part 2100, and generates the period signal OSC. The delay part 2100 is configured to delay the period signal OSC by a predetermined period and output a resultant signal. That is to say, the oscillator 210 generates the period signal OSC with a predetermined period at a time when the control signal CONT is generated at a logic low level.

The internal write signal generation unit 22 is configured to generate the internal write signal INT_WT if it is determined that the combination of the counting signals CNT<1:6> is the first combination, and the internal precharge signal generation unit 23 is configured to generate the internal precharge signal INT_PCG if it is determined that the combination of the counting signals CNT<1:6> is the second combination.

Configurations of the internal write signal generation unit 22 and the internal precharge signal generation unit 23 will be described below in detail with reference to FIG. 8.

Figure 8:
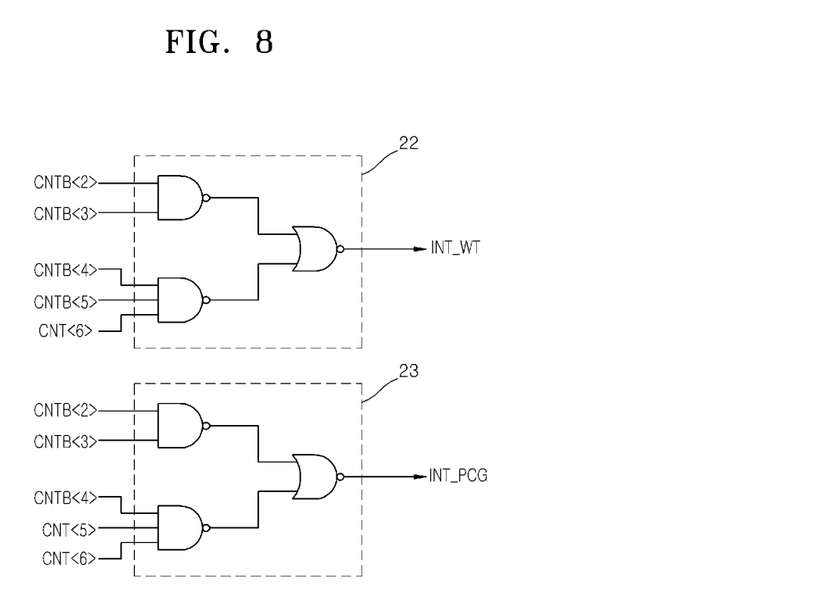
FIG. 8 is a circuit diagram of an internal write signal generation unit and an internal precharge signal generation unit included in the internal command generation block shown in FIG. 2.

Referring to FIG. 8, the internal write signal generation unit 22 generates the internal write signal INT_WT to a logic high level when the combination of the second to sixth counting signals CNT<2:6> is 'L, L, L, L, H'. The internal precharge signal generation unit 23 generates the internal precharge signal INT_PCG to a logic high level when the combination of the second to sixth counting signals CNT<2:6> is 'L, L, L, H, H'. Here, 'L, L, L, L, H' of the second to sixth counting signals CNT<2:6> means that the second counting signal CNT<2> has a logic low level, the third counting signal CNT<3> has a logic low level, the fourth counting signal CNT<4> has a logic low level, the fifth counting signal CNT<5> has a logic low level and the sixth counting signal CNT<6> has a logic high level. Also, 'L, L, L, H, H' of the second to sixth counting signals CNT<2:6> means that the second counting signal CNT<2> has the logic low level, the third counting signal CNT<3> has the logic low level, the fourth counting signal CNT<4> has the logic low level, the fifth counting signal CNT<5> has a logic high level and the sixth counting signal CNT<6> has the logic high level.

Operations of the semiconductor memory device configured as mentioned above will be described below with reference to FIGS. 9 and 10, in which the internal command signals INT_ACT, INT_WT and INT_PCG are generated in synchronization with the rising edge of the external clock CLK inputted from external test equipment, and the semiconductor memory device performs a burn-in test in synchronization with the internal command signals INT_ACT, INT_WT and INT_PCG.

Figure 9:
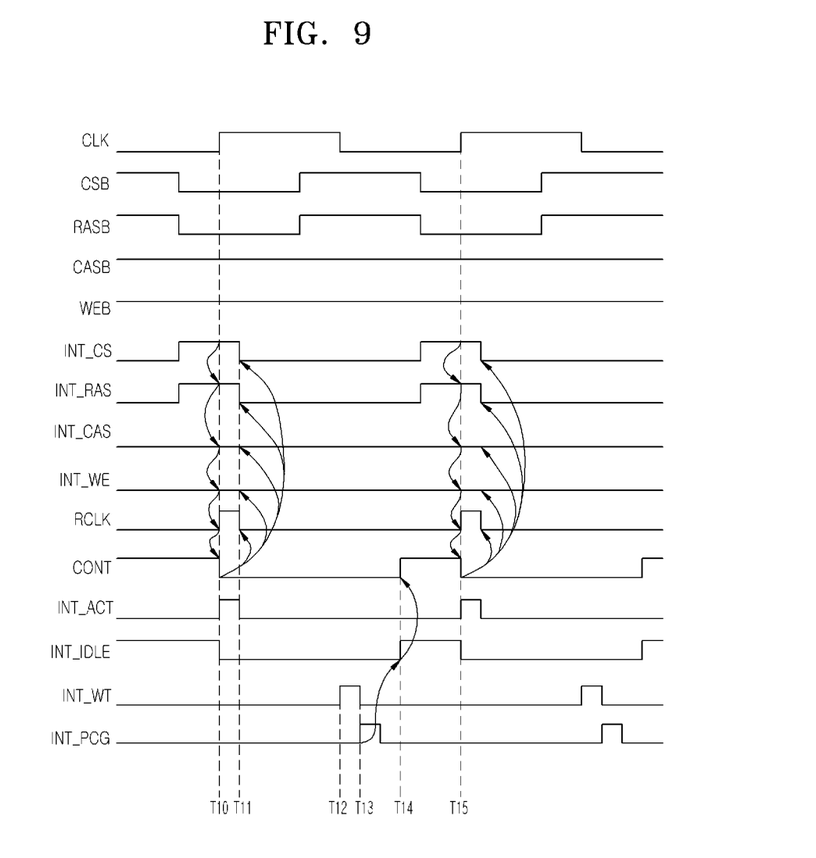
FIGS. 9 and 10 are timing diagrams illustrating operations in which the semiconductor memory device in accordance with an embodiment of the present invention generates internal command signals and performs a burn-in test.
Figure 10:
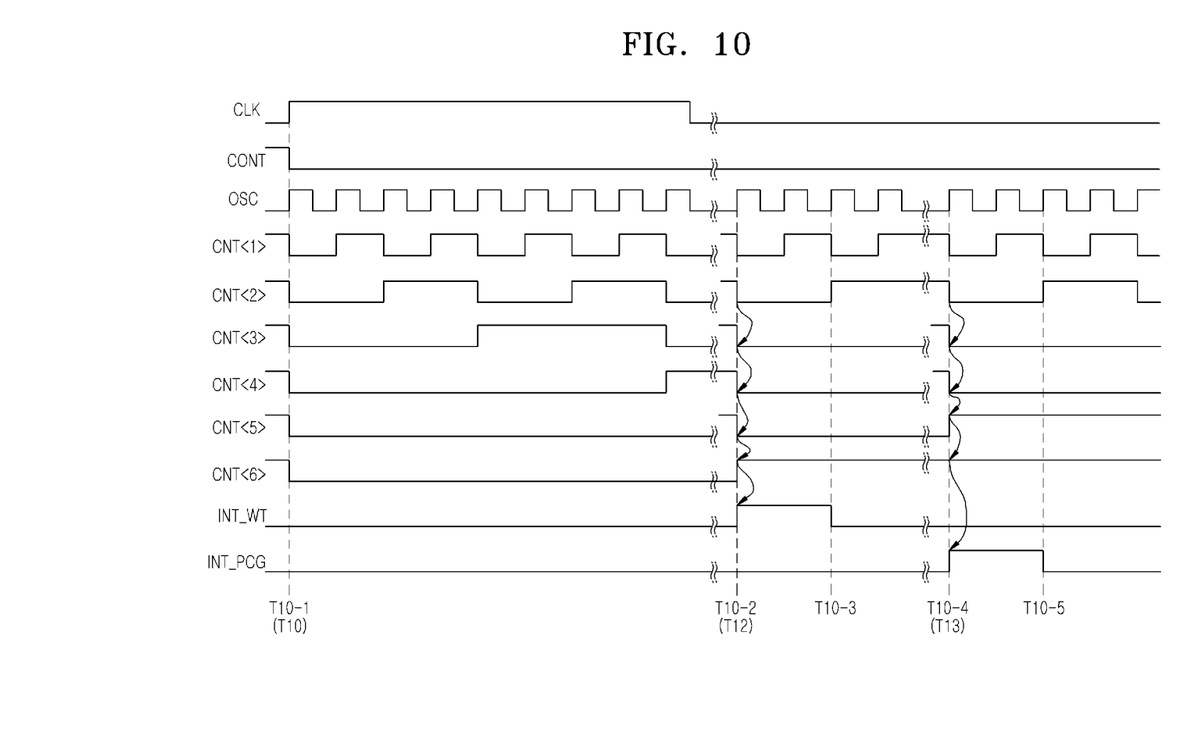

Referring to FIG. 9, first, at a time T10, the clock buffer 11 generates the rising clock RCLK which is enabled in synchronization with the rising edge of the external clock CLK.

The command buffer 12 inversion-buffers the chip select signal CSB of a logic low level inputted from the external test equipment and generates the internal chip select signal INT_CS of the logic high level, inversion-buffers the RAS signal RASB of a logic low level and generates the internal RAS signal INT_RAS of the logic high level, inversion-buffers the CAS signal CASB of a logic high level and generates the internal CAS signal INT_CAS of the logic low level, and inversion-buffers the write enable signal WEB of a logic high level and generates the internal write enable signal INT_WE of the logic low level.

The internal active signal generation unit 13 receives the internal chip select signal INT_CS of the logic high level, the internal RAS signal INT_RAS of the logic high level, the internal CAS signal INT_CAS of the logic low level and the internal write enable signal INT_WE of the logic low level which correspond to when the combination of the internal commands is the preset combination, and generates the internal active signal INT_ACT which is enabled to a logic high level at the enable time of the rising clock RCLK. The semiconductor memory device performs an active operation by the internal active signal INT_ACT which is generated to the logic high level.

The control signal generation unit 15 receives the internal active signal INT_ACT of the logic high level and generates the control signal CONT which transitions from a logic high level to the logic low level, where the control signal CONT is enabled in the logic low level.

The internal idle signal generation unit 14 receives the internal active signal INT_ACT of the logic high level and generates the internal idle signal INT_IDLE which is enabled.

The oscillator 210 of the counting signal generation unit 21 receives the control signal CONT of the logic low level and generates the period signal OSC with the predetermined period. The counter 211 receives the period signal OSC and counts the first to sixth counting signals CNT<1:6>.

The internal write signal generation unit 22 does not generate the internal write signal INT_WT since the combination of the second to sixth counting signals CNT<2:6> is not the first combination. The internal precharge signal generation unit 23 does not generate the internal precharge signal INT_PCG since the combination of the second to sixth counting signals CNT<2:6> is not the second combination.

Next, at a time T11, the clock buffer 11 receives the control signal CONT of the logic low level and disables the rising clock RCLK to a logic low level. The command buffer 12 receives the control signal CONT of the logic low level and disables the internal chip select signal INT_CS, the internal RAS signal INT_RAS, the internal CAS signal INT_CAS and the internal write enable signal INT_WE to logic low levels.

Then, at a time T12, the internal write signal generation unit 22 of the internal command signal generation block 20 generates the internal write signal INT_WT to the logic high level since the combination of the second to sixth counting signals CNT<2:6> is the first combination. The semiconductor memory device performs a write operation by the internal write signal INT_WT which is generated to the logic high level.

In succession, at a time T13, the internal precharge signal generation unit 23 of the internal command signal generation block 20 generates the internal precharge signal INT_PCG to the logic high level since the combination of the second to sixth counting signals CNT<2:6> is the second combination. The semiconductor memory device performs a precharge operation by the internal precharge signal INT_PCG which is generated to the logic high level.

Thereupon, at a time T14, the internal idle signal generation unit 14 receives the internal precharge signal INT_PCG of the logic high level and generates the internal idle signal INT_IDLE which is disabled to a logic high level. The control signal generation unit 15 receives the internal idle signal INT_IDLE of the logic high level and generates the control signal CONT which is disabled to the logic high level.

Thereafter, at a time T15, the clock buffer 11 and the command buffer 12 perform the same operations as the operations at the time T10 to enable the control signal CONT to the logic low level.

At the time T15, the internal active signal generation unit 13 of the internal signal generation block 10 performs the same operation as the operation at the time T10 and generates the internal active signal INT_ACT which is enabled to the logic high level. The control signal generation unit 15 performs the same operation as the operation at the time T10 and generates the control signal CONT which is enabled to the logic low level.

After the time T15, the internal write signal generation unit 21 of the internal command signal generation block 20 performs the same operation as the operation at the time T12 and generates the internal write signal INT_WT of the logic high level. Also, the internal precharge signal generation unit 23 performs the same operation as the operation at the time T13 and generates the internal precharge signal INT_PCG of the logic high level.

In the semiconductor memory device including the above-described configuration, the internal command signals INT_ACT, INT_WT and INT_PCG are generated in synchronization with the rising edge of the external clock CLK, and the burn-in test is performed in synchronization with the internal command signals INT_ACT, INT_WT and INT_PCG.

In detail, operations for the semiconductor memory device to generate the internal write signal INT_WT and the internal precharge signal INT_PCG during the enable period of the control signal CONT generated in synchronization with the rising edge of the external clock CLK will be described below with reference to FIG. 10.

First, at a time T10-1, the oscillator 210 of the counter signal generation unit 21 receives the control signal CONT of the logic low level and generates the period signal OSC with the predetermined period. The counter 211 receives the period signal OSC and counts the first to sixth counting signals CNT<1:6>.

The internal write signal generation unit 22 of the internal command signal generation block 20 does not generate the internal write signal INT_WT since the combination of the second to sixth counting signals CNT<2:6> is not the first combination. The internal precharge signal generation unit 23 of the internal command generation block 20 does not generate the internal precharge signal INT_PCG since the combination of the second to sixth counting signals CNT<2:6> is not the second combination.

Next, at a time T10-2, when the combination of the second to sixth counting signals CNT<2:6> corresponds to the first combination of 'L, L, L, L, H', the internal write signal generation unit 22 of the internal command signal generation block 20 generates the internal write signal INT_WT of the logic high level. Here, 'L, L, L, L, H' of the second to sixth counting signals CNT<2:6> means that the second counting signal CNT<2> has the logic low level, the third counting signal CNT<3> has the logic low level, the fourth counting signal CNT<4> has the logic low level, the fifth counting signal CNT<5> has the logic low level and the sixth counting signal CNT<6> has the logic high level.

Then, at a time T10-3, when the combination of the second to sixth counting signals CNT<2:6> is generated as 'H, L, L, L, H' which is not the first combination, the internal write signal generation unit 22 of the internal command signal generation block 20 generates the internal write signal INT_WT of a logic low level.

In succession, at a time T10-4, when the combination of the second to sixth counting signals CNT<2:6> corresponds to the second combination of 'L, L, L, H, H', the internal precharge signal generation unit 23 generates the internal precharge signal INT_PCG of the logic high level. Here, 'L, L, L, H, H' of the second to sixth counting signals CNT<2:6> means that the second counting signal CNT<2> has the logic low level, the third counting signal CNT<3> has the logic low level, the fourth counting signal CNT<4> has the logic low level, the fifth counting signal CNT<5> has the logic high level and the sixth counting signal CNT<6> has the logic high level.

Thereupon, at a time T10-5, when the combination of the second to sixth counting signals CNT<2:6> is generated as 'H, L, L, H, H' which is not the second combination, the internal precharge signal generation unit 23 of the internal command signal generation block 20 generates the internal precharge signal INT_PCG of a logic low level. The time T10-1 corresponds to the time T10 of FIG. 9, the time T10-2 corresponds to the time T12 of FIG. 9, and the time T10-4 corresponds to the time T13 of FIG. 9.

As is apparent from the above descriptions, in the semiconductor memory device in accordance with an embodiment of the present invention, since the internal command signals INT_ACT, INT_WT and INT_PCG are internally generated in synchronization with the rising edge of the external clock CLK inputted from the outside and the semiconductor memory device operates in synchronization with the internal command signals INT_ACT, INT_WT and INT_PCG, a burn-in test time may be shortened.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A semiconductor memory device comprising:
    an internal signal generation block configured to generate a control signal which is enabled from a generation time of an internal active signal enabled if it is determined that a combination of external commands in synchronization with a rising edge of an external clock inputted from an outside is a preset combination, to a disable time of an internal idle signal; and an internal command signal generation block configured to generate an internal write signal if it is determined that a combination of counting signals counted during an enable period of the control signal is a first combination and generate an internal precharge signal if it is determined that the combination of the counting signals is a second combination.

2. The semiconductor memory device according to claim 1, wherein the control signal is a signal which is enabled at a time when the internal active signal is enabled.

3. The semiconductor memory device according to claim 1, wherein the control signal is a signal which is disabled at a time when the internal idle signal is disabled.

4. The semiconductor memory device according to claim 1, wherein the internal signal generation block comprises:
   an internal active signal generation unit configured to generate the internal active signal if it is determined that a combination of internal commands is the preset combination, in response to a rising clock;
   an internal idle signal generation unit configured to generate the internal idle signal which is enabled from the generation time of the internal active signal to a generation time of the internal precharge signal; and
   a control signal generation unit configured to generate the control signal which is enabled at an enable time if it is determined that the internal active signal is enabled and is disabled if it is determined that the internal idle signal is disabled, in response to a test mode signal.

5. The semiconductor memory device according to claim 4, wherein the internal idle signal is a signal which is disabled at a time when the internal precharge signal is enabled.

6. The semiconductor memory device according to claim 1, wherein the internal command signal generation block comprises:
   a counting signal generation unit configured to count the counting signals in response to the control signal;
   an internal write signal generation unit configured to generate the internal write signal if it is determined that the combination of the counting signals is the first combination; and
   an internal precharge signal generation unit configured to generate the internal precharge signal if it is determined that the combination of the counting signals is the second combination.

7. The semiconductor memory device according to claim 6, wherein the counting signal generation unit comprises:
   an oscillator configured to generate a period signal with a predetermined period at a time when the control signal is inputted after a power-up period in which a level of an internal voltage rises according to a level of a power supply voltage, in response to a reset signal which is enabled during the power-up period; and
   a counter configured to count the counting signals in response to the period signal after the power-up period.

8. The semiconductor memory device according to claim 1, wherein the internal signal generation block further comprises:
   a clock buffer configured to generate the rising clock which is enabled in synchronization with the rising edge of the external clock, in response to the control signal; and
   a command buffer configured to buffer the external commands in response to the control signal and generate the internal commands.

9. A semiconductor memory device comprising:
   an internal active signal generation unit configured to generate an internal active signal if it is determined that a combination of internal commands is a preset combination, in synchronization with a rising edge of an external clock inputted from an outside;
   an internal idle signal generation unit configured to generate an internal idle signal which is enabled from a generation time of the internal active signal to a generation time of an internal precharge signal; and
   a control signal generation unit configured to generate a control signal which is enabled from the generation time of the internal active signal to a disable time of the internal idle signal, in response to a test mode signal.

10. The semiconductor memory device according to claim 9, wherein the internal active signal is a signal which is enabled if it is determined that the combination of the internal commands is the preset combination, in response to a rising clock enabled in synchronization with the rising edge of the external clock.

11. The semiconductor memory device according to claim 9, wherein the control signal is a signal which is enabled at a time when the internal active signal is enabled.

12. The semiconductor memory device according to claim 9, wherein the control signal is a signal which is disabled at a time when the internal idle signal is disabled.

13. The semiconductor memory device according to claim 9, wherein the internal idle signal is a signal which is enabled at a time when the internal active signal is enabled.

14. The semiconductor memory device according to claim 9, wherein the internal idle signal is a signal which is disabled at a time when the internal precharge signal is enabled.

15. The semiconductor memory device according to claim 9, further comprising:
   a counting signal generation unit configured to count counting signals in response to the control signal;
   an internal write signal generation unit configured to generate an internal write signal if it is determined that a combination of the counting signals is a first combination; and
   an internal precharge signal generation unit configured to generate the internal precharge signal if it is determined that the combination of the counting signals is a second combination.

16. The semiconductor memory device according to claim 15, wherein the counting signal generation unit comprises:
   an oscillator configured to generate a period signal with a predetermined period at a time when the control signal is inputted after a power-up period in which a level of an internal voltage rises according to a level of a power supply voltage, in response to a reset signal which is enabled during the power-up period; and
   a counter configured to count the counting signals in response to the period signal after the power-up period.

17. A semiconductor memory device comprising an internal command signal generation block configured to generate internal command signals in synchronization with a rising edge of an external clock that is inputted from a source external to the semiconductor device, such that the memory device operates in synchronization with the internal commands signals to perform a burn in test.

18. The semiconductor device according to claim 1, further comprising:
   an internal signal generation block configured to generate a control signal which is enabled from a generation time of an internal active signal enabled if it is determined that a combination of external commands in synchronization with the rising edge of the external clock inputted from an outside is a preset combination, to a disable time of an internal idle signal; wherein the internal command signals include an internal write signal, and the internal command signal generation block is configured to generate the internal write signal if it is determined that a combination of counting signals counted during an enable period of the control signal is a first combination and generate an internal precharge signal if it is determined that the combination of the counting signals is a second combination.

19. The semiconductor memory device according to claim 2, wherein the internal signal generation block comprises:

an internal active signal generation unit configured to generate the internal active signal if it is determined that a combination of internal commands is the preset combination, in response to a rising clock;

an internal idle signal generation unit configured to generate the internal idle signal which is enabled from the generation time of the internal active signal to a generation time of the internal precharge signal; and a control signal generation unit configured to generate the control signal which is enabled at an enable time when the internal active signal is enabled and is disabled when the internal idle signal is disabled, in response to a test mode signal.

20. The semiconductor memory device according to claim 18, wherein the internal command signal generation block comprises:

a counting signal generation unit configured to count the counting signals in response to the control signal;

an internal write signal generation unit configured to generate the internal write signal if it is determined that the combination of the counting signals is the first combination; and an internal precharge signal generation unit configured to generate the internal precharge signal if it is determined that the combination of the counting signals is the second combination.

* * * * *